United States Patent
Huang et al.

(10) Patent No.: US 6,984,564 B1
(45) Date of Patent: Jan. 10, 2006

(54) STRUCTURE AND METHOD TO IMPROVE SRAM STABILITY WITHOUT INCREASING CELL AREA OR OFF CURRENT

(75) Inventors: Shih-Fen Huang, Bedford Corners, NY (US); Clement Wann, Carmel, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,184

(22) Filed: Jun. 24, 2004

(51) Int. Cl.
*H01L 21/8234* (2006.01)
*H01L 21/8238* (2006.01)
(52) U.S. Cl. ...................... 438/275; 438/200
(58) Field of Classification Search ............ 438/200, 438/275; 257/E21.661
See application file for complete search history.

(56) References Cited

U.S. PATENT DOCUMENTS

| 2003/0181005 A1* | 9/2003 | Hachimine et al. ......... 438/231 |
| 2004/0029323 A1* | 2/2004 | Shimizu et al. ............. 438/142 |
| 2004/0217420 A1* | 11/2004 | Yeo et al. .................. 257/347 |
| 2005/0023633 A1* | 2/2005 | Yeo et al. .................. 257/500 |

* cited by examiner

*Primary Examiner*—Matthew Smith
*Assistant Examiner*—Lex H. Malsawma
(74) *Attorney, Agent, or Firm*—Todd M.C. Li

(57) ABSTRACT

An SRAM in a CMOS integrated circuit is subjected to stress on the channels of its transistors; compressive stress on the pull-up and pass gate transistors and tensile stress on the pull-down transistors in a version designed to improve stability; and compressive stress on the pull-up transistors and tensile stress on the pull-down and pass gate transistors in a version designed to reduce the cell size and increase speed of operation.

9 Claims, 7 Drawing Sheets

US 6,984,564 B1

STRUCTURE AND METHOD TO IMPROVE SRAM STABILITY WITHOUT INCREASING CELL AREA OR OFF CURRENT

BACKGROUND OF INVENTION

The field of the invention is that of integrated circuit SRAMs.

The shrinking of MOSFET dimensions for high density, low power and enhanced performance requires reduced power supply voltages. As a result, dielectric thickness and channel length of the transistors are scaled with power supply voltage.

However, SRAM stability is severely impacted by this scaling. Small mismatches in the devices during processing can cause the cell to favor one of the states, either a 1 or a 0. Mismatches can result from dislocations between the drain and the source or from dopant implantation or thermal anneal temperature fluctuation.

The SRAM cell stability determines the soft-error and the sensitivity of the memory cell to variations in process and operating conditions. One important parameter for the stability is called "beta ratio", which is the ratio between pull-down transistor drive current and pass-gate transistor drive current. Higher beta ratio results in better stability. However, it also results in a larger cell size. There is a trade-off between the cell area and the stability of the cell.

The art could benefit from a method to compensate and desensitize the parameters of small transistors to process fluctuations.

SUMMARY OF INVENTION

The invention relates to a SRAM memory cell providing increased stability while maintaining the same cell area.

A feature of the invention is the application of compressive stress to the pass-gate transistors and tensile stress to the pull-down transistors, thereby adjusting the SRAM parameters to increase stability.

Another feature of the invention is forming the compressive stress by depositing an etch stop layer with parameters that produce the desired stress in operation.

Another feature of the invention is forming the tensile stress by implanting the etch stop layer with ions that convert the compressive stress to tensile stress.

Another feature of the invention is reducing the area of the cell while maintaining the same beta ratio.

DETAILED DESCRIPTION

The present invention is directed at providing an improved SRAM memory cell with: a) increased stability while maintaining the same cell area; or b) reducing the cell area while providing the same stability.

Figure 4:
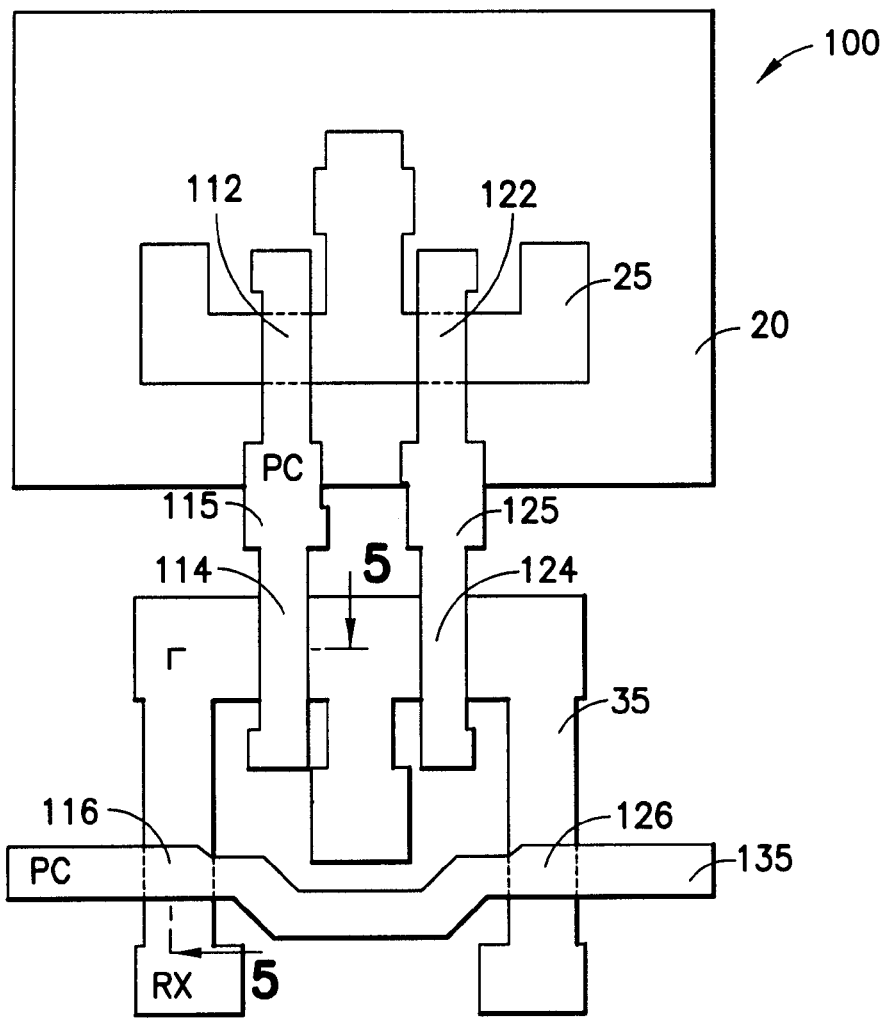
FIG. 4 illustrates a layout of an SRAM cell for use with the invention.

FIG. 4 shows a top view of an SRAM cell 100 suitable for use with the invention. The SRAM memory cell has a common layout, comprising two cross-coupled inverters in a symmetric and complementary arrangement, where each of the inverters is connected with a pass gate NFET transistor. The wafer is illustratively p-type, with an N-well 20 for the PFETs 112 and 122 at the top of the Figure. PFETs 112 and 122 are formed in active area 25 in the N-well.

In the lower portion of the Figure, active area 35 holds the two pull-down NFETs 114 and 124 and the corresponding pass gates (or NFET pass transistors) 116 and 126. Transistors 112 and 114 form one inverter and transistors 122 and 124 form the other. The cross connections between the two inverters are not shown to simplify the drawing. Node 115 formed from a polysilicon (poly) strip is used to form the gates of the first inverter. Similarly, node 125 is used to form the gates of the second inverter. Poly strip 135 is used to form the gates of the pass transistors 116 and 126.

By changing the stress level in the Si3N4 etch stop layer, one can increase pull-up PFET drive current. A compressive stress nitride etch stop layer will induce compressive stress in the transistor channel, which will increase the hole mobility and therefore increase the PFET drive current. The compressive stress will also reduce the PFET Vt, which will also increase the PFET drive current.

Increasing the stress over the small normal amounts found in standard processing increases the pass-gate NFET threshold voltage (and therefore decreases its drive current). The pull-down NFETs of each inverter within the memory cell have a tensile stress, which increases the threshold voltage (and therefore produces a lower drive current).

The result of changing the stress of these two NFETs is that the SRAM cell becomes more stable because the beta ratio is increased. Changing only one of the two types of NFET (pass-gate or pull-down) would produce a beneficial change, but changing them both is preferred.

Both transistors having compressive stress and those having tensile stress will be referred to in the claims as "stressed transistors", meaning that the magnitude of stress in both types of transistor is significantly different from the amount of stress considered acceptable for normal transistors in that technology.

Those skilled in the art will appreciate that processes are designed such that the stresses that are inevitably produced in a transistor have effects on the operating parameters of the transistor that are within the acceptable range for the circuits being formed. There are always fluctuations in the transistor performance reflecting, in part, fluctuations in the manufacturing process. Circuit designers have adapted to these fluctuations and design the circuit to perform within a range of tolerable parameters.

The memory cell may be made either from bulk silicon, or from a semiconductor-on-insulator technology.

Figure 1:
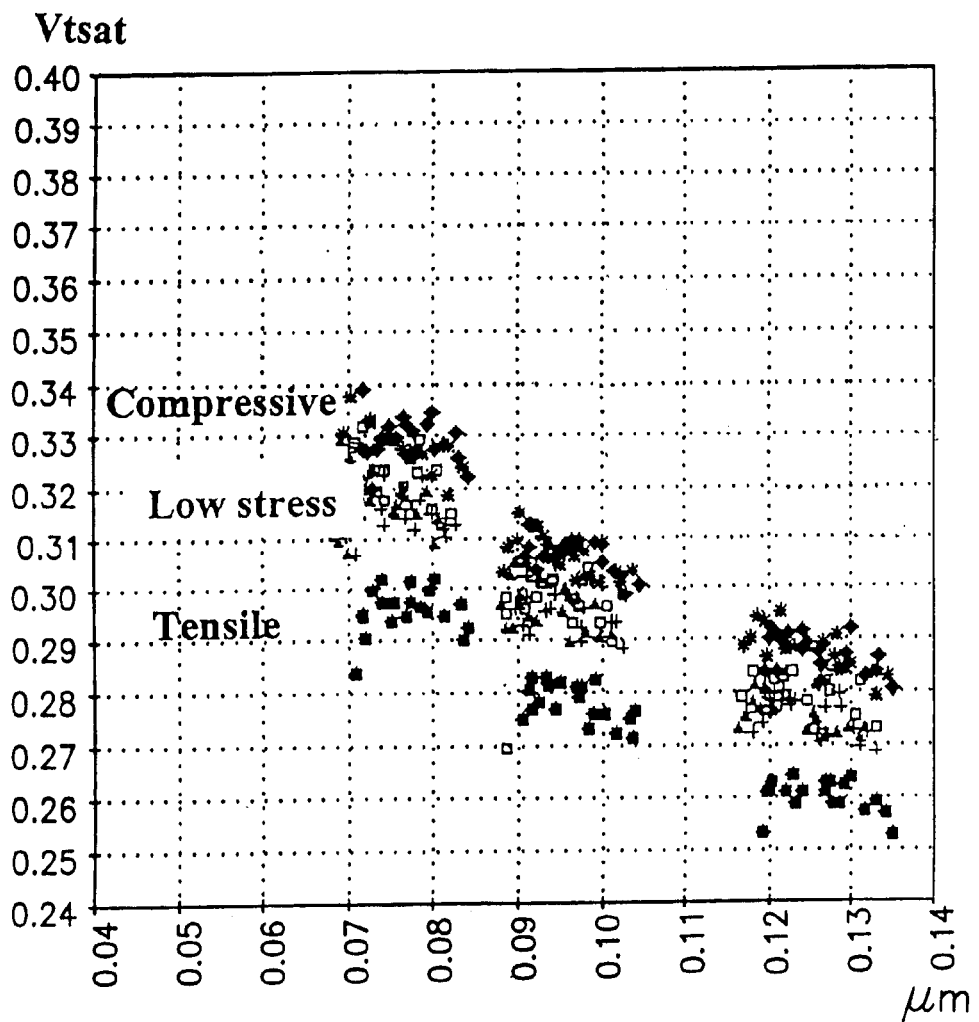
FIG. 1 illustrates variation in NFET Vt as a function of the stress in a nitride etch stop layer.

FIG. 1 illustrates the effect of stress on Vt for NFETs. When a compressive nitride is applied to the pass-gate transistor, its threshold voltage (Vt) increases (nominally by 30 mV in the illustrative example). This comparison is made between the three sets of points—Compressive, Low Stress and Tensile that were made with a layer of nitride covering (enclosing) the transistors. The nominal Vt for an NFET in that technology is about 0.3V.

The nitride was deposited by Plasma Enhanced Chemical Vapor Deposition (PECVD) on a wafer at 400 degrees C. with RF power at 900 watts in a tool from Applied Materials, Inc. Other deposition tools will have different preferred powers and the process parameters will be set empirically in light of the transistor dimensions, the nitride thickness and other relevant factors. Those skilled in the art will be aware that the net stress on the transistor body will depend on many factors, including the thermal history of the circuit.

The increase of the Vt brings its drive current down (by 20% for the example illustrated, in which the Vt changed by 30 mV).

Figure 2:
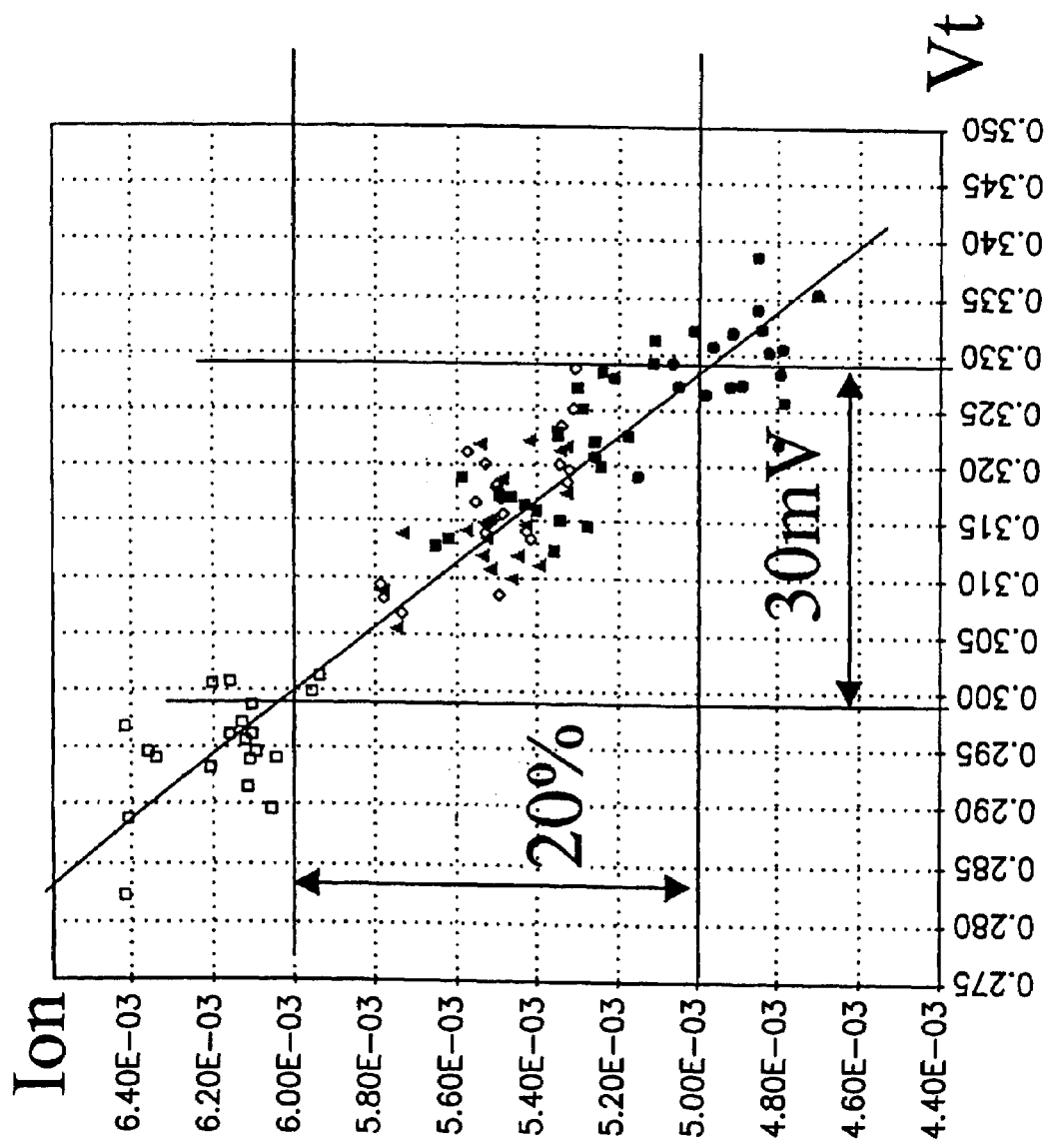
FIG. 2 illustrates the relation between a Vt shift and a drive current change.

FIG. 2 illustrates the relationship between Vt and the drive current for the illustrative example, which was an NFET having a 45 nm line width technology. Other processes will have different relationships between Vt and drive current.

Figure 3:
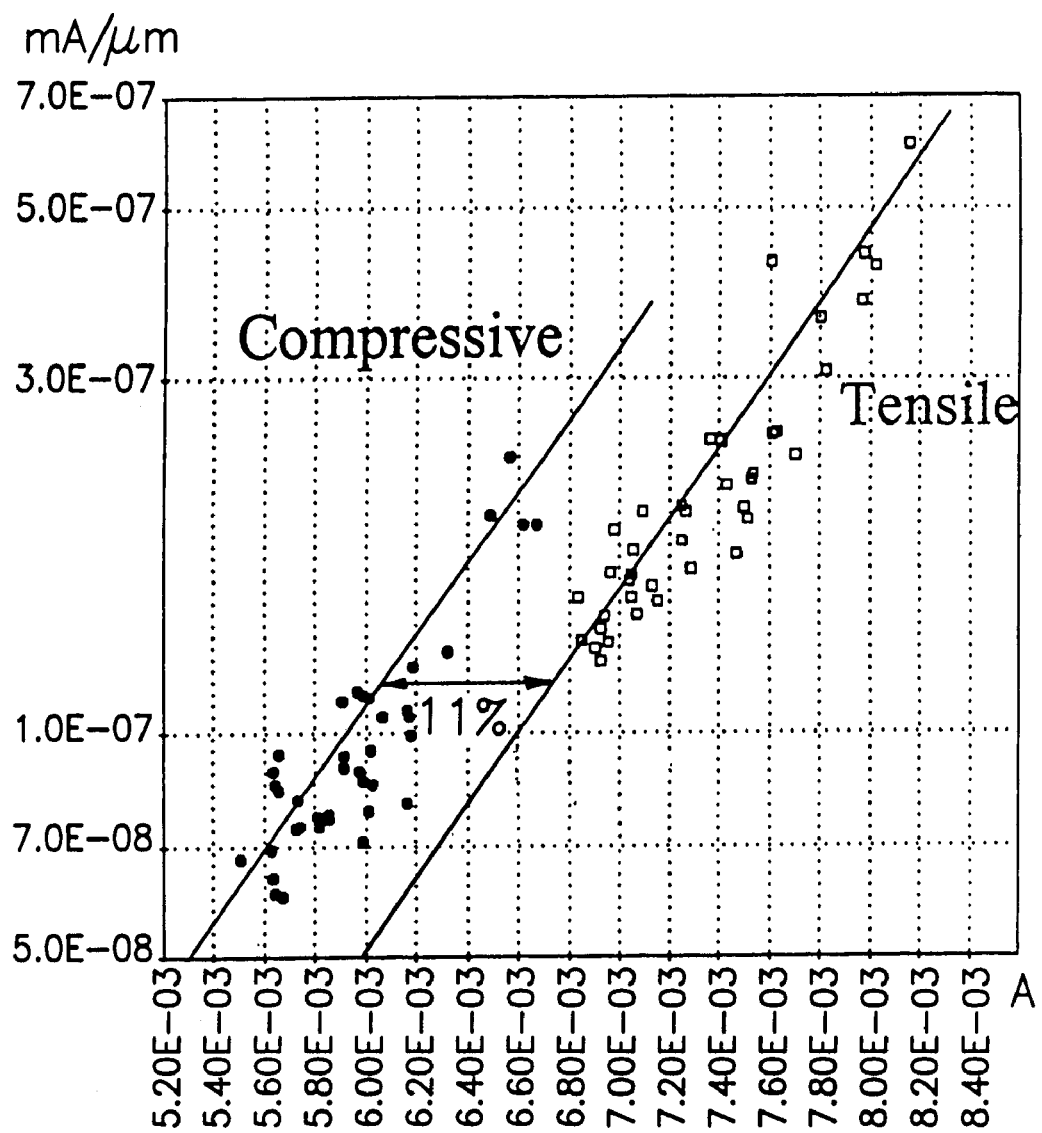
FIG. 3 illustrates that NFET drive current can be increased when a tensile nitride is applied as an etch stop layer and decreased when the stress is compressive.

On the other hand, as illustrated in FIG. 3, tensile stress applied on the pull-down gate increases its drive current (by 11% for this case). These data were taken by comparing NFETs of the same size with a compressive nitride layer (the left line) and tensile stress (the right line).

The data shown in FIG. 3 result in a increase of the SRAM beta ratio from 2.1 without the stress application to 2.9. This higher beta ratio is achieved without increasing the cell area.

In addition to the significant advantage of greater stability of the SRAM cell, there are two other advantages:
1. The SRAM off current is maintained, while other stability-enhancing methods method such as channel counter doping will increase the transistor off current.
2. The Beta ratio is tunable at a later stage of the manufacturing process, which permits compensation for process variations.

If, in a particular technology and circuit, the SRAM stability is adequate, the invention may be applied to maintain the same beta ratio, but shrink the cell size, by decreasing the pull-down and pass gate transistor width. Since the pull-down width is decreased, the pull-up width may be decreased also. Using the same example quoted above, one can reduce cell area by 5–15%, depending on the scaling method.

FIG. 3 shows data for compressive and tensile stress applied to a typical NFET. NFET drive current can be increased when a tensile nitride is applied as the etch stop layer, and decreased when a compressive nitride is used. PFET drive current behaves in the opposite way. The vertical axis is $I_{on}$ in units of mA/micron.

Figure 5:
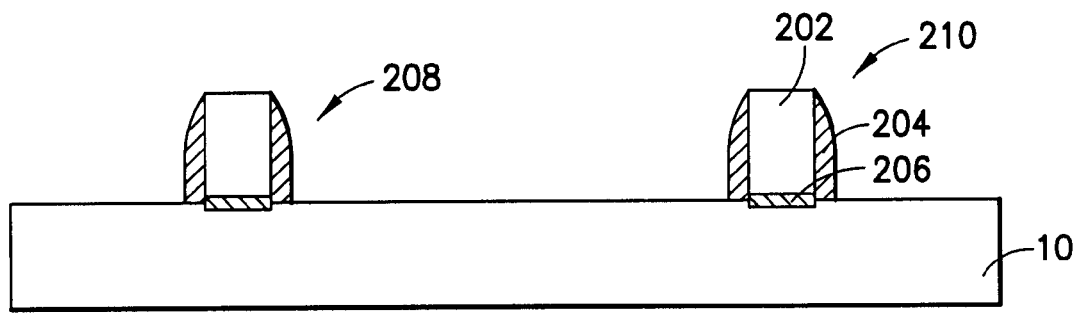
FIG. 5 illustrates a cross section of a pass transistor and a pull-down transistor that will receive a stress layer according to the invention.

FIG. 5 illustrates a cross-section along the 5—5 direction in the SRAM layout of FIG. 4, showing two transistors, pass gate 208 and pull-down transistor 210, each having a poly gate and an off-set spacer built on Si substrate 10. The transistor construction is conventional, with gate di-electric 206 separating the body in the wafer from gate 202. Spacers 204 have a thickness set to define the offset distance between the source and drain (S/D) and the transistor body.

Figure 6:
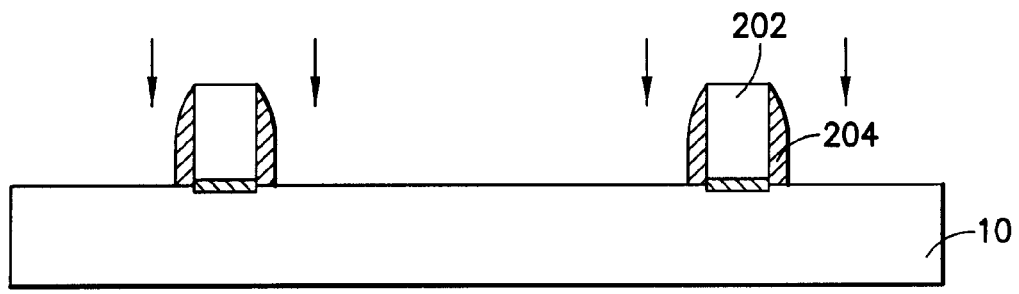
FIG. 6 illustrates implantation of halo and extension implants.

FIG. 6 shows the conventional extension and halo implantation being performed after off-set spacer is formed. The low-doped drain extension will be located outside the region defined by the offset spacers 204. For NFETs, the implant species is P or As. The implant energy and dosage are set by the process parameters for the particular technology being implemented and do not change when the invention is practiced.

Figure 7:
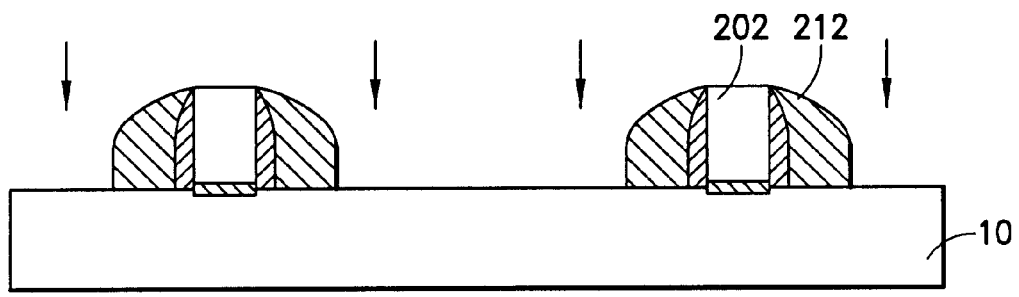
FIG. 7 illustrates formation of a second spacer to define the location of Source/Drain implants.

FIG. 7 shows a set of second spacers 212 being formed, followed with P or As source/drain implants. The width of the second spacer is set to define the length of the low-doped drain extension. The source and drain are formed outside the region defined by the second spacers 212. In this view, the entire area between the transistors will be implanted. Other transistors will have the outer extent of the S/D defined by a mask.

Figure 8:
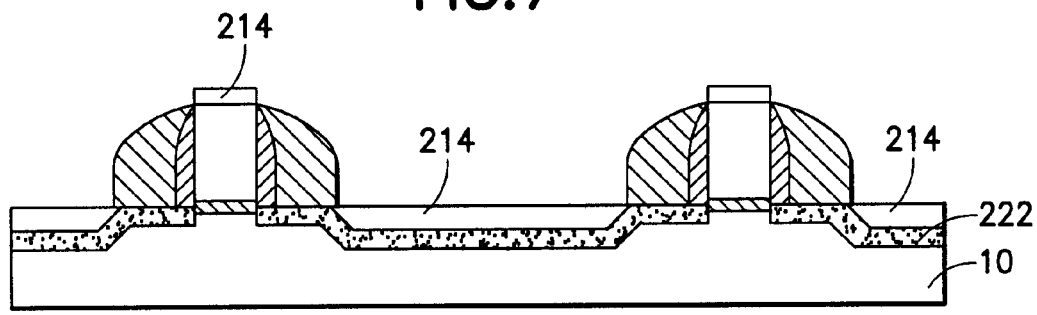
FIG. 8 illustrates formation of silicide over the gate and S/D of the transistors.

FIG. 8 shows the result of forming a silicide on the exposed silicon of the source, drain and gate. Silicide 214 is formed on the surface. Area 222 below the surface represents the implanted area of the source and drain.

Figure 9:
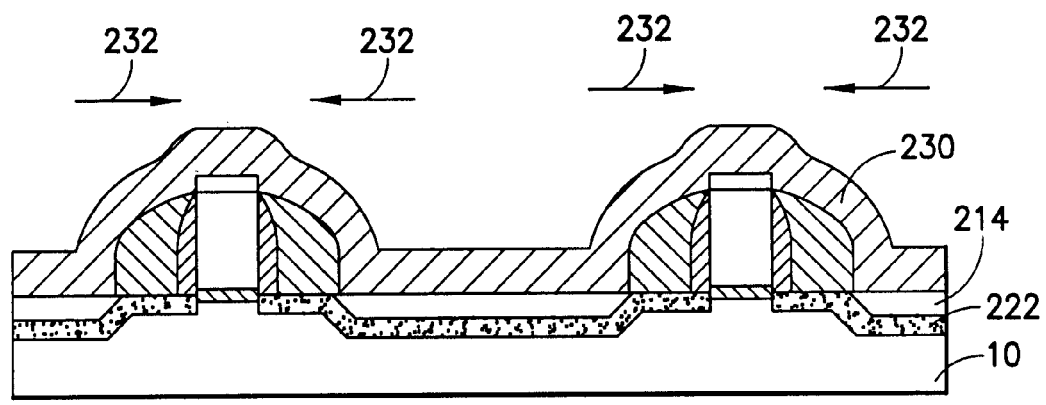
FIG. 9 illustrates deposition of the nitride compressive/etch stop layer.

FIG. 9 shows the result of depositing 40 nm of a compressive nitride (Si3N4) etch stop layer 230. Ordinarily, a process sequence will have parameters that are chosen to reduce stress, since silicon is piezo-electric and stress in the transistor body will affect the operating parameters.

In this case, a particular stress is desired, as described below. The nitride is deposited at an elevated temperature and the difference in coefficient of thermal expansion will cause stress to be exerted on the enclosed material within the generally hemispherical shell formed by the nitride. Arrows 232 indicate the desired net horizontal compressive stress exerted on the transistor body. The term compressive stress and tensile stress refer to the horizontal component in the transistor body. There will be components of the stress in other directions, e.g. vertical, but they are not relevant to the invention.

Ordinarily, process parameters are selected to reduce stress. Those skilled in the art will appreciate that the desired amount of stress can be applied to the body by a combination of adjusting the plasma power density during deposition, increasing the thickness of the nitride film and/or reducing the gate spacer thickness to bring the nitride closer to the transistor channel.

The process designer will specify the thickness of layer 230 in connection with typical manufacturing tradeoffs. In general, a thicker layer will exert greater stress. Since the layer is an etch stop, it must be at least thick enough to protect the underlying films during the etch process.

Figure 10:
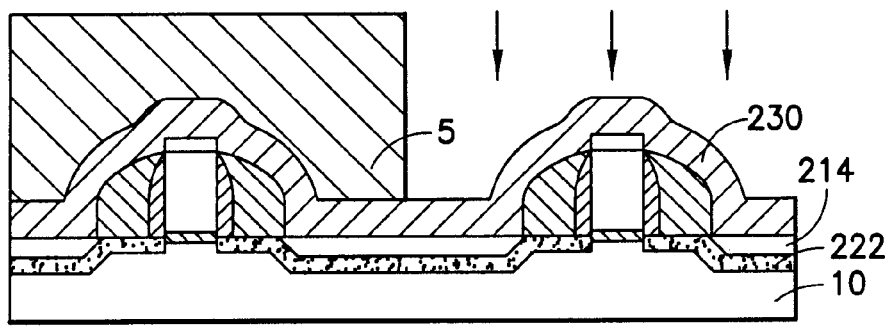
FIG. 10 illustrates implantation of ions into the stress layer over the pull-down transistors.

FIG. 10 shows a photo resist blocking mask 5 patterned to expose the pull-down transistors 114 and 124 of the cell. These transistors are implanted in layer 230 to change the type of stress from compressive to tensile. The implantation is performed using ions such as Ge, Ar, N, or Xe. A low temperature anneal, illustratively 500–600 degrees C degrees for 30 seconds is performed to set the stress.

The anneal is at a lower temperature than the anneals that activate dopants in silicon, so that this anneal will not have a significant effect on previous implants (if any). The function of this anneal is to restore broken bonds in the nitride that were broken by ion implantation (Si—N, Si—H and Si—NH bonds). The nitride becomes neutral in stress after the implantation. Re-establishing the broken bonds produces the desired tensile stress.

Figure 11:
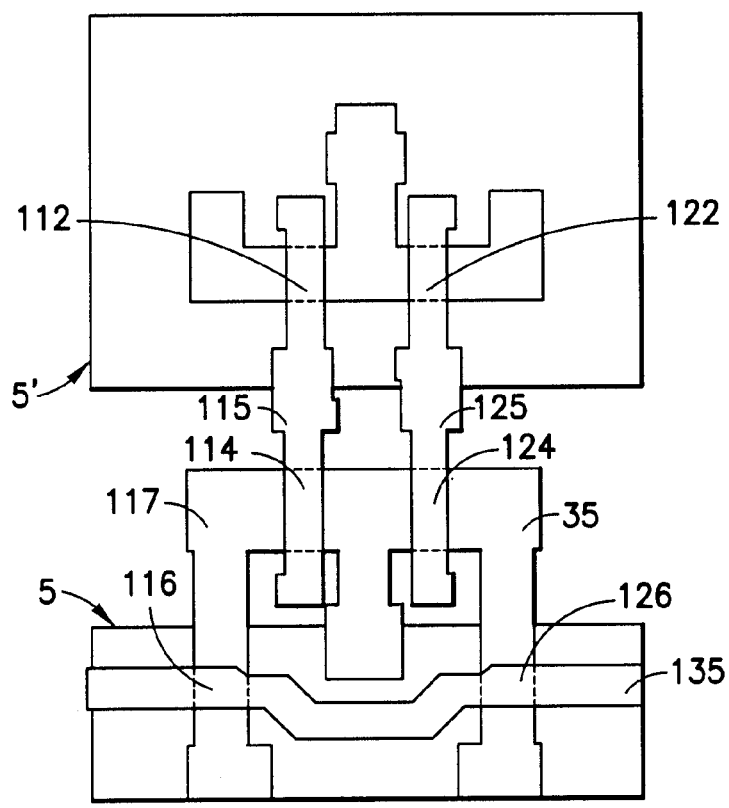
FIG. 11 illustrates a top view of the mask for the implantation.

FIG. 11 shows a top view of the photo resist pattern, with the pass transistors 116 and 126 covered by resist 5, with resist 5' covering the PFET transistors 112 and 122. The mask alignment is non-critical, since more or less coverage of the silicide outside the transistors does not matter.

Figure 12:
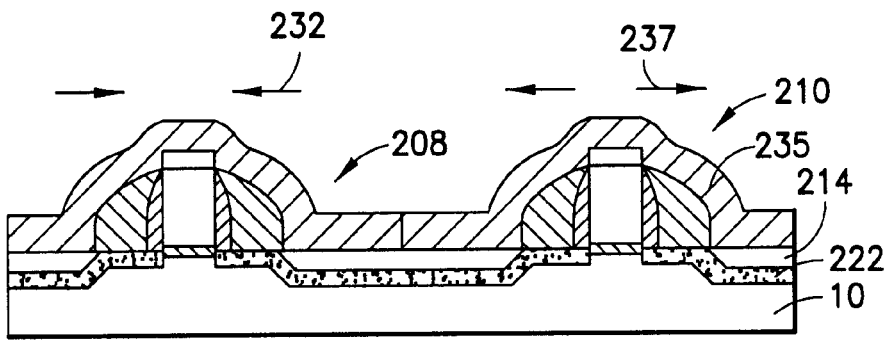
FIG. 12 illustrates the difference in stress after an anneal according to the invention.

FIG. 12 shows the result after the anneal, with pass gate 208 having compressive stress and pull-down transistor 210 having tensile stress. The implant dosage will be enough to compensate for the compressive stress of layer 230 and to contribute the desired amount of tensile stress. The amount of doping and the parameters of the anneal will be set empirically to produce the desired result. In the example illustrated, $1\times10^{15}$ ions/cm$^2$ of Ge were implanted. Arrows 232 represent the compressive stress and arrows 237 represent the tensile stress. The implant voltage will be set to produce coverage of layer 230, without significant penetration into the transistor body. The source and drain are not significantly affected by the magnitude of this implant.

Figure 13:
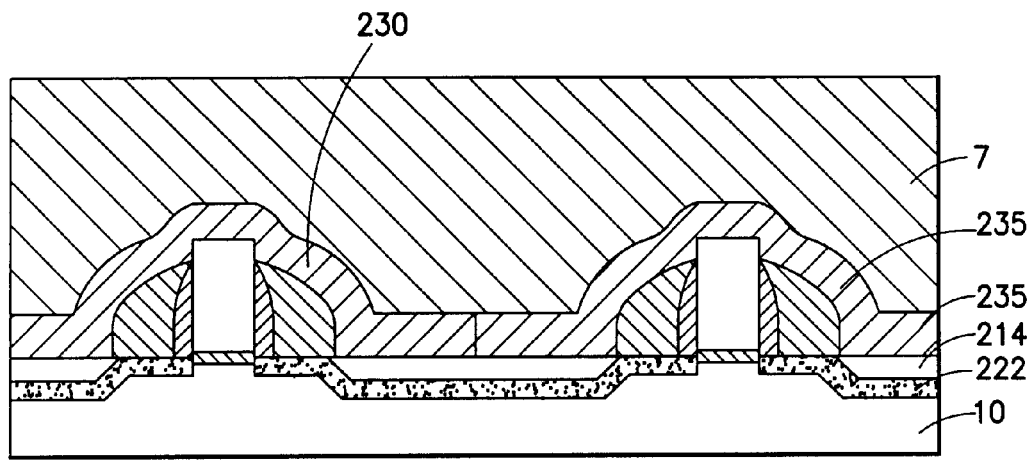
FIG. 13 illustrates deposition of interlayer dielectric over the transistors.

FIG. 13 shows the result of depositing an interlayer dielectric 7 such as oxide or BPSG. The difference in coefficient of thermal expansion between oxide and nitride (and the other materials present) will cause stress to be exerted on all the transistors. This stress was present in the prior art and the methods of adjusting transistor parameters such that the desired transistor performance is achieved in operation are well known to those skilled in the art.

Dielectric 7 will be etched to form contact apertures in a conventional etch that is stopped by layer 230 or 235.

Figure 14:
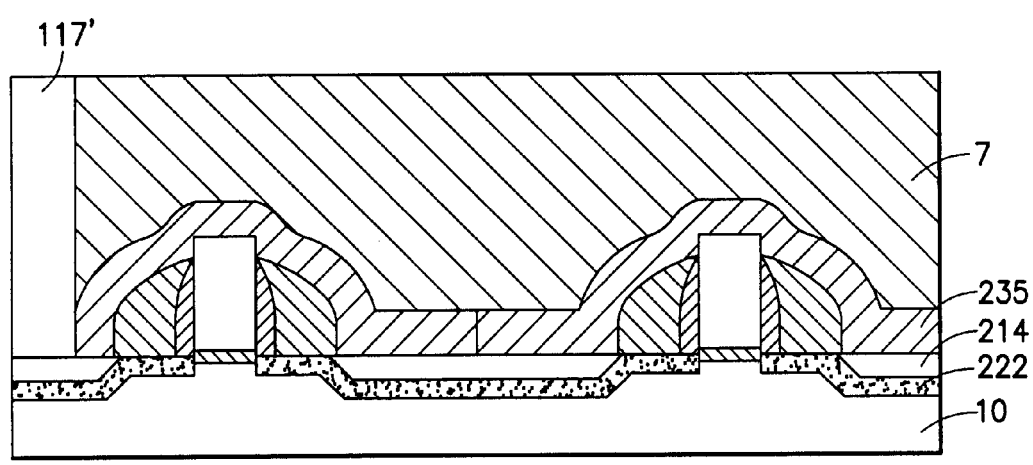
FIG. 14 illustrates the transistors after the formation of a contact.

FIG. 14 shows the result of forming a metal contact 117' to the external node connecting the pass gate to the rest of the circuit (i.e. to a sense amplifier) and the gates of the inverter formed by transistors 112 and 114.

The preceding discussion has dealt with the two transistors on line 5—5 for convenience of illustration. The same process will preferably be applied to the transistors 126 and 124 of the other inverter.

Those skilled in the art will appreciate that other materials may be substituted for those described above in order to produce the same effect. Layer 230 need not be nitride and it need not function as an etch stop layer. The practice of the invention is not restricted to silicon and other semiconductors, such as SiGe and Ge may be used. The invention may be practiced with either bulk wafers or in a wafer having a semiconductor layer separated from a bulk substrate (e.g. silicon on insulator).

The method of converting compressive stress to tensile stress illustrated is preferred, but another material having a tensile stress, such as PECVD nitride might be deposited in a separate step; or the same material might be used, but deposited in a separate step with parameters such that the stress is tensile during circuit operation.

Those skilled in the art will appreciate that the terms compressive and tensile are relative and refer to the difference between those stresses and normal stress in the transistor. Normal stress in the transistor will be referred to in the claims as "unstressed", since the stress according to the invention is relative to the normal magnitude. For example, the normal stress could be compressive, with the "compressive" stress having a greater magnitude and the "tensile" stress also being compressive, but with a smaller magnitude.

The circuit designer may choose to put down the stress material only on SRAM cells, with other NFETs being left with whatever materials are part of the standard process being used, e.g. nitride deposited at a standard temperature that does not significantly stress the NFETs. Alternatively, the designer may choose to put down the stress nitride on all NFETs and therefore stress all the NFETs, with compensating adjustments to the threshold implant, transistor size or other parameters to deliver the desired electrical performance.

Table 1 illustrates options available for the various transistor types in the SRAM cell—Pull-up (PFET), Pull-down (NFET) and Pass gate (NFET).

|  | Pull-up | Pull-down | Pass Gate |  |
|---|---|---|---|---|
| Compressive | X |  | X | Better stability |
| Tensile |  | X |  |  |
| Compressive | X |  |  | Smaller size, |
| Tensile |  | X | X | faster |

While the invention has been described in terms of a single preferred embodiment, those skilled in the art will recognize that the invention can be practiced in various versions within the spirit and scope of the following claims.

What is claimed is:

1. A method of forming an SRAM cell in an integrated circuit having first and second pull-down and first and second pull-up transistors connected as cross-coupled inverters having first and second input nodes connected to first and second pass gate transistors, comprising the steps of:
   forming said transistors in a semiconductor substrate;
   depositing a first layer of dielectric material over at least one of said pass gate transistors at a deposition temperature such that said at least one pass gate transistor is subject to a compressive magnitude of compressive stress in operation, said magnitude of compressive stress being adapted to raise the threshold voltage of said at least one pass gate transistor; and
   applying stress to at least one of said pull-down transistors connected to said at least one pass gate transistor such that said at least one pull-down transistor is subject to a tensile magnitude of tensile stress in operation, said magnitude of tensile stress being adapted to lower the threshold voltage of said at least one pull-down transistor.

2. A method of forming an SRAM cell in an integrated circuit having first and second pull-down and first and second pull-up transistors connected as cross-coupled inverters having first and second input nodes connected to first and second pass gate transistors, comprising the steps of:
   forming said transistors in a semiconductor substrate;
   depositing a first layer of dielectric material over at least one of said pass gate transistors at a deposition temperature such that said at least one pass gate transistor is subject to a compressive magnitude of compressive stress in operation, said magnitude of compressive stress being adapted to raise the threshold voltage of said at least one pass gate transistor;
   depositing a second layer of dielectric material over at least one of said pull-down transistors connected to said at least one pass gate transistor such that said at least one pull-down transistor is subject to a tensile magnitude of tensile stress in operation, said magnitude of tensile stress being adapted to lower the threshold voltage of said at least one pull-down transistor.

3. A method according to claim 2, in which said first and second pull-down transistors have said magnitude of tensile stress and said first and second pass gate transistors have said magnitude of compressive stress.

4. A method of forming an SRAM cell in an integrated circuit having first and second pull-down and first and second pull-up transistors connected as cross-coupled inverters having first and second input nodes connected to first and second pass gate transistors, comprising the steps of:

forming said transistors in a semiconductor substrate;

depositing a first layer of dielectric material over at least one of said pull-up transistors connected to said at least one pass gate transistor such that said at least one pull-up transistor is subject to a compressive magnitude of compressive stress in operation, said magnitude of compressive stress being adapted to lower the threshold voltage of said at least one pull-up transistor: and applying stress by ion implantation to at least one of said pull-down transistors connected to said at least one pass gate transistor such that said at least one pull-down transistor is subject to a tensile magnitude of tensile stress in operation, said magnitude of tensile stress being adapted to lower the threshold voltage of said at least one pull-down transistor.

5. A method of forming an SRAM cell in an integrated circuit having first and second pull-down and first and second pull-up transistors connected as cross-coupled inverters having first and second input nodes connected to first and second pass gate transistors, comprising the steps of:

forming said transistors in a semiconductor substrate;

depositing a layer of dielectric material over at least one of said pull-up transistors at a deposition temperature such that said at least one pull-up transistor is subject to a compressive magnitude of compressive stress in operation, said magnitude of compressive stress being adapted to lower the threshold voltage of said at least one pull-up transistor; and applying stress to at least one of said pull-down transistors connected to said at least one pull-up transistor such that said at least one pull-down transistor is subject to a tensile magnitude of tensile stress in operation, said magnitude of tensile stress being adapted to lower the threshold voltage of said at least one pulldown transistor.

6. A method according to claim 5, in which said first and second pull-down transistors and said first and second pass gate transistors have said magnitude of tensile stress.

7. A method according to claim 6, in which said first and second pull-up transistors have said magnitude of compressive stress.

8. A method of forming an SRAM cell in an integrated circuit having first and second pull-down and first and second pull-up transistors connected as cross-coupled inverters having first and second input nodes connected to first and second pass gate transistors, comprising the steps of:

forming said transistors in a semiconductor substrate;

depositing a layer of dielectric material over at least one of said pull-up transistors at a deposition temperature such that said at least one pull-up transistor is subject to a compressive magnitude of compressive stress in operation, said magnitude of compressive stress being adapted to lower the threshold voltage of said at least one pull-up transistor;

depositing a second layer of dielectric material over at least one of said pull-down transistors connected to said at least one pull-up transistor such that said at least one pull-down transistor is subject to a tensile magnitude of tensile stress in operation, said magnitude of tensile stress being adapted to lower the threshold voltage of said at least one pull-down transistor.

9. A method according to claim 8, further comprising a step of depositing said second layer of dielectric material over at least one of said pass gate transistors connected to said at least one pull-up transistor such that said at least one pass gate transistor is subject to said tensile magnitude of tensile stress in operation, said magnitude of tensile stress being adapted to lower the threshold voltage of said at least one pass gate transistor.

\* \* \* \* \*